(12) United States Patent
Yin et al.

(10) Patent No.: US 9,833,975 B2
(45) Date of Patent: Dec. 5, 2017

(54) GAS BARRIER COMPOSITE FILM

(71) Applicant: INDUSTRIAL TECHNOLOGY RESEARCH INSTITUTE, Hsinchu (TW)

(72) Inventors: Hui-En Yin, Taipei (TW); Dan-Cheng Kong, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 168 days.

(21) Appl. No.: 14/660,175

(22) Filed: Mar. 17, 2015

(65) Prior Publication Data

US 2016/0121586 A1    May 5, 2016

(30) Foreign Application Priority Data

Oct. 29, 2014   (TW) .............................. 103137349 A

(51) Int. Cl.
*B32B 27/08*     (2006.01)
*B32B 27/36*     (2006.01)
(Continued)

(52) U.S. Cl.
CPC ............ *B32B 27/08* (2013.01); *B32B 27/285* (2013.01); *B32B 27/286* (2013.01); *B32B 27/288* (2013.01); *B32B 27/304* (2013.01); *B32B 27/308* (2013.01); *B32B 27/36* (2013.01); *B32B 27/365* (2013.01); *H01L 31/0203* (2013.01); *B32B 2255/10* (2013.01); *B32B 2255/20* (2013.01); *B32B 2255/26* (2013.01); *B32B 2255/28* (2013.01); *B32B 2270/00* (2013.01);
(Continued)

(58) Field of Classification Search
None
See application file for complete search history.

(56) References Cited

U.S. PATENT DOCUMENTS 5,326,848 A * 7/1994 Kashimura ............ C08G 63/60
                                                    528/176
5,770,301 A * 6/1998 Murai ..................... B32B 27/08
                                                    427/387

(Continued)

FOREIGN PATENT DOCUMENTS

CN         1287916 A       3/2001
CN       101267938 A       9/2008
(Continued)

OTHER PUBLICATIONS

Dou, "How to improve the barrier performance of plastic film", was published on www.evergreen-packaging.com, Jan. 5, 2012.
(Continued)

*Primary Examiner* — Tahseen N Khan
(74) *Attorney, Agent, or Firm* — Birch, Stewart, Kolasch & Birch, LLP

(57) ABSTRACT

A gas barrier composite film is provided. The gas barrier composite film includes a substrate layer; a functional layer disposed on one or two sides of the substrate layer, wherein the functional layer includes a first copolymer of p-hydroxybenzoic acid and 6-hydroxy-2-naphthoic acid, or a second copolymer of acrylic acid and vinylidene dichloride, and an inorganic stack layer disposed on the functional layer.

9 Claims, 2 Drawing Sheets

(51) Int. Cl.
  *B32B 27/30* (2006.01)
  *H01L 31/0203* (2014.01)
  *B32B 27/28* (2006.01)
  *H01L 51/52* (2006.01)
  *H01L 51/44* (2006.01)

(52) U.S. Cl.
  CPC ... *B32B 2307/546* (2013.01); *B32B 2307/584* (2013.01); *B32B 2307/7242* (2013.01); *B32B 2307/7246* (2013.01); *B32B 2457/00* (2013.01); *B32B 2457/12* (2013.01); *B32B 2457/206* (2013.01); *H01L 51/448* (2013.01); *H01L 51/5253* (2013.01)

(56) References Cited

U.S. PATENT DOCUMENTS

| | | | | |
|---|---|---|---|---|
| 6,013,373 | A * | 1/2000 | Kuder | B32B 27/08 428/411.1 |
| 6,042,902 | A * | 3/2000 | Kuder | B32B 7/12 156/325 |
| 2002/0104982 | A1 | 8/2002 | St. Lawrence et al. | |
| 2007/0231592 | A1 * | 10/2007 | Agata | C08J 7/045 428/522 |
| 2011/0081502 | A1 * | 4/2011 | Bright | B05D 1/60 427/569 |
| 2013/0156994 | A1 | 6/2013 | Hsu et al. | |
| 2013/0316182 | A1 * | 11/2013 | Mori | B05D 1/60 428/448 |
| 2014/0120282 | A1 * | 5/2014 | Kim | B29C 45/16 428/35.7 |

FOREIGN PATENT DOCUMENTS

| | | |
|---|---|---|
| CN | 102026805 A | 4/2011 |
| JP | 2004-249614 A | 9/2004 |

OTHER PUBLICATIONS

Taiwanese Office Action and Search Report dated Dec. 24, 2015 for Application No. 103137349.
Chinese Office Action for Appl. No. 201510015518.7 4 dated May 16, 2017.

* cited by examiner

GAS BARRIER COMPOSITE FILM

CROSS REFERENCE TO RELATED APPLICATIONS

The present application is based on, and claims priority from, Taiwan Application Serial Number 103137349, filed on Oct. 29, 2014, the disclosure of which is hereby incorporated by reference herein in its entirety.

TECHNICAL FIELD

The technical field relates to a gas barrier film for blocking gas and moisture, and in particular it relates to a flexible gas barrier composite film.

BACKGROUND

Flexible electronic devices belong to a new technological field, in which an optoelectronic device is manufactured on a flexible substrate. Flexible electronic devices have humanization and convenient because they are light-weight, thin, and portable, and the like. Therefore, they have attracted the attention of the global high-tech industry. Flexible electronic devices usually include a substrate of plastic or metal. Compared to a metal-sheet substrate, a plastic substrate has advantages such as greater transparency and flexibility. However, the plastic substrate has a low moisture/oxygen barrier effect. As such, the active layer and the high work function electrode in the optoelectronic device may react with moisture and oxygen, therefore limiting the development of flexible electronic device. Accordingly, a gas barrier composite film is usually called for to allow the flexible electronic device to block moisture and oxygen from entering the optoelectronic device. In other words, the gas barrier composite film may sustain the optoelectronic device performance and lengthen the optoelectronic device lifetime.

As such, the development of a transparent and flexible gas barrier composite film is critical for flexible electronic devices.

SUMMARY

One embodiment of the disclosure provides a gas barrier composite film, comprising: a substrate layer; a surface functional layer disposed on one or two sides of the substrate layer, and an inorganic stack layer disposed on the functional layer, wherein the functional layer comprises a first copolymer of p-hydroxybenzoic acid and 6-hydroxy-2-naphthoic acid, or a second copolymer of acrylic acid and vinylidene dichloride.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1:
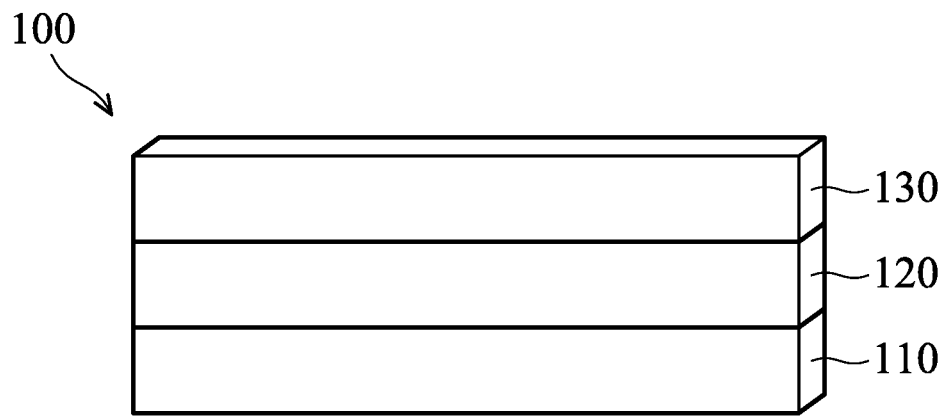
FIG. 1 shows a gas barrier composite film in one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are shown schematically in order to simplify the drawing.

In one embodiment, the gas barrier composite film 100 has a substrate layer 110, a surface functional layer 120 on one side or two sides of the substrate layer 110, and an inorganic stack layer 130 on the surface functional layer 120. The surface functional layer 120 can be a first copolymer of p-hydroxybenzoic acid and 6-hydroxy-2-naphthoic acid, or a second copolymer of acrylic acid and vinylidene dichloride.

In one embodiment, the substrate layer 110 can be a soft flexible material such as polyethylene terephthalate (PET), polyethylene naphthalate (PEN), poly(methyl methacrylate) (PMMA), polycarbonate (PC), polyethersulfone (PES), polyetheretherketone (PEEK), or a combination thereof.

In one embodiment, the surface functional layer 120 may increase the gas barrier effect and stability of the substrate layer 110. The surface functional layer 120 has a lower gas transmission rate than the substrate layer, and is denser than the substrate layer. The surface functional layer 120 can be attached or coated on the substrate layer 110. The synergy of the surface functional layer 120 and the inorganic stack layer 130 may increase the gas barrier effect. In one embodiment, the surface functional layer can be the first copolymer formed by polymerization of 60 mol % to 80 mol % of p-hydroxybenzoic acid and 40 mol % to 20 mol % of 6-hydroxy-2-naphthoic acid. A high ratio of the p-hydroxybenzoic acid may increase the processability of the first copolymer. A high ratio of the 6-hydroxy-2-naphthoic acid may increase the gas barrier effect of the first copolymer, but decrease the processability of the first copolymer. In another embodiment, the surface functional layer 120 can be the second copolymer formed by polymerization of 10 mol % to 50 mol % of acrylic acid and 90 mol % to 50 mol % of vinylidene dichloride. High ratio of the acrylic acid may increase the processability of the second copolymer. High ratio of the vinylidene dichloride may increase the gas barrier effect of the second copolymer, but decrease the processability of the second copolymer. In one embodiment, the surface functional layer may have a thickness of 0.1 µm to 100 µm. In another embodiment, the surface functional layer may have a thickness of 1 µm to 50 µm.

Figure 2:
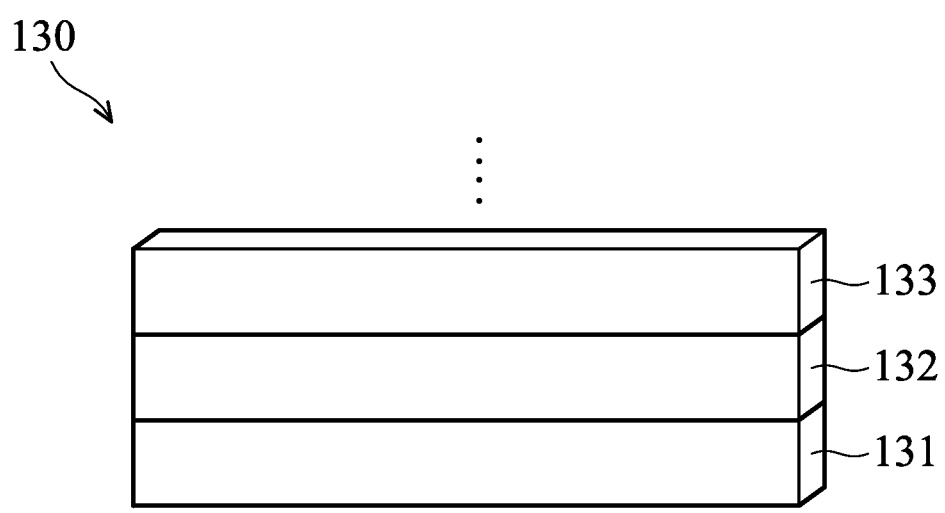
FIG. 2 shows an inorganic stack layer in one embodiment of the disclosure.

In another embodiment, the inorganic stack layer 130 is composed of a plurality of inorganic layers, as shown in FIG. 2. For example, a first inorganic layer 131 is deposited, a second inorganic layer 132 is then deposited, a third inorganic layer 133 is then deposited, and so on. The deposition can be performed hundreds of times to form hundreds of inorganic layers. The inorganic stack layer 130 can be a stack of two alternating inorganic materials with an ultra low pinhole density. The inorganic stack layer 130 can be formed by hundreds of atomic layer depositions to be a major gas barrier layer. In one embodiment, the inorganic stack layer 130 includes a stack of at least two alternating layers selected from a group consisting of aluminum oxide, zinc oxide, zirconium oxide, hafnium oxide, silicon oxide, and indium nitride. For example, one layer of the inorganic stack layer 130 can be aluminum oxide, one layer of the inorganic stack layer 130 can be selected from a group consisting of zinc oxide, zirconium oxide, hafnium oxide, silicon oxide, and indium nitride, and the two layers are alternating stacked. In one embodiment, the inorganic stack layer can be a stack of alternating hundreds of aluminum oxide layers and zirconium oxide layers. The stack of alternating inorganic materials in the inorganic stack layer 130 can be formed by chemical vapor deposition (CVD), pulsed laser deposition (PLD), atomic layer deposition (ALD), or the like. In another embodiment, the inorganic stack layer can be formed on the surface functional layer by ALD, and the synergy of the surface functional layer and the inorganic stack layer may increase the gas barrier effect of the composite film.

In one embodiment, each of the layers in the inorganic stack layer has a thickness of 1 Å to 2 Å, and the inorganic stack layer has a total thickness of 10 nm to 50 nm. For example, the inorganic stack layer 130 may include a stack of alternating aluminum oxide layers and zirconium oxide layers, and each of the aluminum oxide layers and each of the zirconium oxide layers have a conduction period ratio of 20:10 to 20:100 during the depositions. In another embodiment, each of the aluminum oxide layers and each of the zirconium oxide layers have a conduction period ratio of 20:20 to 20:30 during the depositions. First, an aluminum oxide layer can be deposited, and a zirconium oxide can be then deposited. Another aluminum oxide layer can be then deposited on the zirconium oxide, and so on. The above steps can be repeated hundreds of times to complete the inorganic stack layer.

Figure 3:
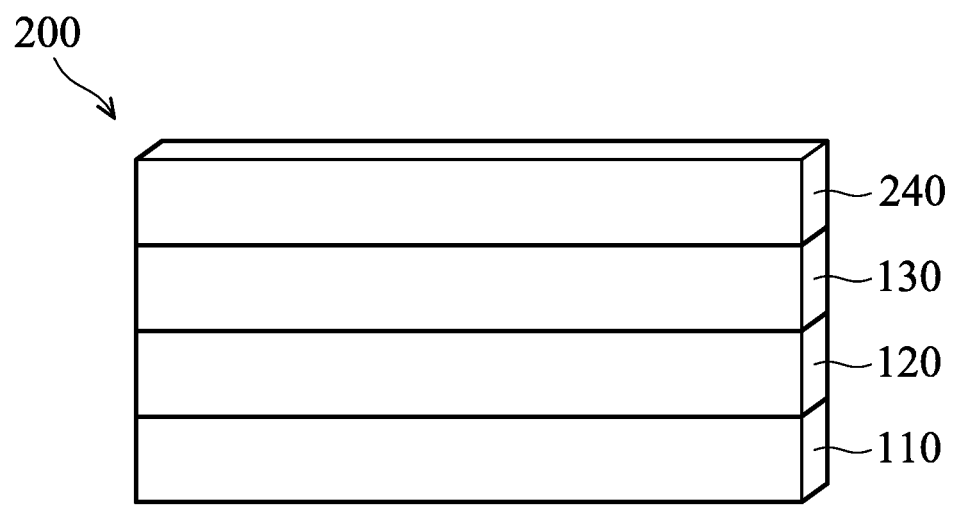
FIG. 3 shows a gas barrier composite film in one embodiment of the disclosure.

In one embodiment, the gas barrier composite film 200 further includes a protection layer 240 on the inorganic stack layer 130, as shown in FIG. 3. The protection layer can be polyurethane-acrylate, epoxy acrylate, polyacrylate, polyester, or a combination thereof. The protection layer 240 may block gas and prevent the inorganic stack layer from scratch. In other words, the protection layer 240 may physically protect the inorganic stack layer. In one embodiment, the protection layer can be formed by coating a UV glue of polyurethane-acrylate on the inorganic stack layer, and then curing the UV glue by a UV exposure machine. As such, a gas barrier composite film structure of substrate layer 110/ surface functional layer 120/inorganic stack layer 130/protection layer 240 is completed. In one embodiment, the protection layer may have a thickness of 1 μm to 8 μm. In another embodiment, the protection layer may have a thickness of 1 μm to 5 μm.

Below, exemplary embodiments will be described in detail with reference to the accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

EXAMPLES

In Examples 1 to 3, the surface functional layer was a first copolymer formed by polymerization of 73 mol % of p-hydroxybenzoic acid and 27 mol % of 6-hydroxy-2-naphthoic acid. The surface functional layer had a thickness of 50 μm.

Example 1

PET/Surface Functional Layer/200 Layers of $Al_2O_3$/Protection Layer

The surface functional layer was attached onto a PET substrate layer with a thickness of 188 μm, and then cured by a UV to complete a PET/surface functional layer structure. Subsequently, an inorganic stack layer of pure aluminum oxide layers was formed by atomic layer deposition (ALD), which was performed with precursors of trimethyl aluminum (TMA) and water. The ALD steps are listed below:

(1) TMA was conducted onto a surface of the surface functional layer for 20 milliseconds, such that the TMA was adsorbed onto the surface functional layer and reacted with the —OH functional groups of the surface of the surface functional layer to form byproduct methane ($CH_4$). The reaction was $Al(CH_3)_3$ (g)+—OH (s)→—O—$Al(CH_3)_2$ (s)+ $CH_4$.

(2) Nitrogen with a flow rate of 200 sccm was conducted for 6 seconds to remove unreacted TMA and methane.

(3) Water vapor was conducted for 20 milliseconds, such that the water vapor was reacted with the methyl group of the TMA bonded on the surface of the surface functional layer to form byproduct methane. The reaction was $2H_2O_{(g)}$+—O—$Al(CH_3)_2$ $_{(s)}$→—O—$Al(OH)_2$ $_{(s)}$+2 $CH_4$.

(4) Nitrogen with a flow rate of 200 sccm was conducted for 6 seconds to remove unreacted water vapor and methane.

One cycle of the above steps (1) to (4) formed one $Al_2O_3$ layer. The cycle was repeated 200 times to deposit a pure aluminum oxide stack layer (200 layers of $Al_2O_3$) on the PET/surface functional layer. Thereafter, a UV glue of polyurethane-acrylic acid was coated on the inorganic stack layer by spin-on coating, and then cured by a UV exposure machine to form a protection layer. As such, a gas barrier composite film structure of PET/surface functional layer/ 200 layers of $Al_2O_3$/protection layer was completed. The gas barrier composite film structure in Example 1 had an oxygen transmission rate of 0.05 cc/m$^2$-day-atm, which was measured by ASTM D3985.

Example 2

PET/Surface Functional Layer/200 Layers of $ZrO_2$/Protection Layer

The PET/surface functional layer structure was similar to that in Example 1. An inorganic stack layer of pure zirconium oxide layers was then formed by ALD, which was performed with precursors of tetrakis(dimethylamido)zirconium(IV) (TDMAZr) and water. The ALD steps are listed below:

(1) TDMAZr was conducted onto a surface of the surface functional layer for 20 milliseconds, such that the TDMAZr was adsorbed onto the surface functional layer and reacted with the —OH functional groups of the surface of the surface functional layer to form byproduct $HN(CH_3)_2$. The reaction was $Zr[N(CH_3)_2]_4$ $_{(g)}$+—O—$H_{(s)}$→—O—$Zr[N(CH_3)_2]_3$ $_{(s)}$+$HN(CH_3)_2$.

(2) Nitrogen with a flow rate of 200 sccm was conducted for 6 seconds to remove unreacted TDMAZr and $HN(CH_3)_2$.

(3) Water vapor was conducted for 20 milliseconds, such that the water vapor was reacted with the methyl group of the TDMAZr bonded on the surface of the surface functional layer to form byproduct $HN(CH_3)_2$. The reaction was $3H_2O_{(g)}$+—O—$Zr[N(CH_3)_2]_3$ $_{(s)}$→—O—$Zr(OH)_3$ $_{(s)}$+3 $HN(CH_3)_2$.

(4) Nitrogen with a flow rate of 200 sccm was conducted for 6 seconds.

One cycle of the above steps (1) to (4) formed one $ZrO_2$ layer. The cycle was repeated 200 times to deposit a pure zirconium oxide stack layer (200 layers of $ZrO_2$) on the PET/surface functional layer. Thereafter, a UV glue of polyurethane-acrylic acid was coated on the inorganic stack layer by spin-on coating, and then cured by a UV exposure machine to form a protection layer. As such, a gas barrier composite film structure of PET/surface functional layer/200 layers of $ZrO_2$/protection layer was completed. The gas barrier composite film structure in Example 2 had an oxygen transmission rate of 0.41 $cc/m^2$-day-atm, which was measured by ASTM D3985.

Example 3

PET/Surface Functional Layer/Stack of 200 Layers of Alternating $Al_2O_3$ and $ZrO_2$/Protection Layer The PET/surface functional layer structure was similar to that in Example 1. An inorganic stack layer of alternating zirconium oxide layers and aluminum oxide layers was then formed by ALD, which was performed with precursors of TMA, TDMAZr, and water. In the ALD cycle, the conduction period of the TMA was fixed at 20 milliseconds, and the conduction period of the TDMAZr was verified as X (X=2, 5, 10, 20, 30, 50, 100, 200, 300, 500) milliseconds for checking its influence on the gas barrier property. The ALD steps for depositing the inorganic stack layer are listed below:

(1) TMA was conducted for 20 milliseconds.
(2) Nitrogen with a flow rate of 200 sccm was conducted for 6 seconds.
(3) Water vapor was conducted for 20 milliseconds.
(4) Nitrogen with a flow rate of 200 sccm was conducted for 6 seconds.
(5) TDMAZr was conducted for X milliseconds (X=2, 5, 10, 20, 30, 50, 100, 200, 300, 500).
(6) Nitrogen with a flow rate of 200 sccm was conducted for 6 seconds.
(7) Water vapor was conducted for 20 milliseconds.
(8) Nitrogen with a flow rate of 200 sccm was conducted for 6 seconds.

One cycle of the above steps (1) to (8) formed a stack of alternating $Al_2O_3$ and $ZrO_2$ layers. The cycle was repeated 200 times to deposit an alternating stack of aluminum oxide and zirconium oxide layers (200 layers of $Al_2O_3/ZrO_2$) on the PET/surface functional layer. Thereafter, a UV glue of polyurethane-acrylic acid was coated on the inorganic stack layer by spin-on coating, and then cured by a UV exposure machine to form a protection layer. As such, a gas barrier composite film structure of PET/surface functional layer/stack of 200 layers of alternating $Al_2O_3$ and $ZrO_2$/protection layer was completed.

The aluminum oxide conduction period and the zirconium oxide conduction period might have a ratio of 20:20 to 20:100, or 20:20 to 20:30. When the aluminum oxide conduction period and the zirconium oxide conduction period had a ratio of 20:30, the gas barrier composite film had an oxygen transmission rate of 0.02 $cc/m^2$-day-atm (measured by ASTM D3985), and a water vapor transmission rate of less than 0.0005 $g/m^2$-day (measured by ASTM F1249). Moreover, the gas barrier composite film had an oxygen transmission rate of 0.05 $cc/m^2$-day-atm and a water vapor transmission rate of 0.001 $g/m^2$-day after being put at 25° C. and 60% RH for 30 days.

Examples 1 to 3 are tabulated in Table 1.

TABLE 1

|  | Example 1 | Example 2 | Example 3 |
| --- | --- | --- | --- |
| Substrate layer | PET | PET | PET |

TABLE 1-continued

|  | Example 1 | Example 2 | Example 3 |
| --- | --- | --- | --- |
| Surface functional layer | Copolymer of 73 mol % of p-hydroxy-benzoic acid and 27 mol % of 6-hydroxy-2-naphthoic acid | Copolymer of 73 mol % of p-hydroxy-benzoic acid and 27 mol % of 6-hydroxy-2-naphthoic acid | Copolymer of 73 mol % of p-hydroxy-benzoic acid and 27 mol % of 6-hydroxy-2-naphthoic acid |
| Inorganic stack layer (total 200 layers) | Pure $Al_2O_3$ layers, total 200 layers, and each layer had a thickness of about 1.2 Å | Pure $ZrO_2$ layers, total 200 layers, and each layer had a thickness of about 1.2 Å | Stack of alternating $Al_2O_3/ZrO_2$, total 200 layers, and each layer had a thickness of about 1.2 Å |
| Oxygen transmission rate (ASTM D3985) | 0.05 $cc/m^2$-day-atm | 0.41 $cc/m^2$-day-atm | 0.02 $cc/m^2$-day-atm |

In Examples 4 to 6, the surface functional layer was a second copolymer formed by polymerization of 30 mol % of acrylic acid and 70 mol % of vinylidene dichloride. The surface functional layer had a thickness of 10 μm.

Example 4

PET/Surface Functional Layer/200 Layers of $Al_2O_3$/Protection Layer

Example 4 was similar to Example 1, and the difference in Example 4 was the surface functional layer being made of the aforementioned second copolymer with a thickness of 10 μm. An inorganic stack layer of pure aluminum oxide layers was formed on the PET/surface functional layer by ALD, which was performed with precursors of TMA and water. The ALD steps in Example 4 were similar to those in Example 1.

One cycle of the above steps (1) to (4) formed one $Al_2O_3$ layer. The cycle was repeated 200 times to deposit a pure aluminum oxide stack layer (200 layers of $Al_2O_3$) on the PET/surface functional layer. Thereafter, a UV glue of polyurethane-acrylic acid was coated on the inorganic stack layer by spin-on coating, and then cured by a UV exposure machine to form a protection layer. As such, a gas barrier composite film structure of PET/surface functional layer/200 layers of $Al_2O_3$/protection layer was completed. The gas barrier composite film structure in Example 4 had an oxygen transmission rate of 0.05 $cc/m^2$-day-atm, which was measured by ASTM D3985.

Example 5

PET/Surface Functional Layer/200 Layers of $ZrO_2$/Protection Layer

The PET/surface functional layer in Example 5 was similar to that in Example 4. An inorganic stack layer of pure zirconium oxide layers was formed on the PET/surface functional layer by ALD, which was performed with precursors of TDMAZr and water. The ALD steps in Example 5 were similar to those in Example 2.

One cycle of the above steps (1) to (4) formed one $ZrO_2$ layer. The cycle was repeated 200 times to deposit a pure zirconium oxide stack layer (200 layers of $ZrO_2$) on the PET/surface functional layer. Thereafter, a UV glue of polyurethane-acrylic acid was coated on the inorganic stack layer by spin-on coating, and then cured by a UV exposure machine to form a protection layer. As such, a gas barrier composite film structure of PET/surface functional layer/200 layers of $ZrO_2$/protection layer was completed. The gas barrier composite film structure in Example 5 had an oxygen transmission rate of 4.5 cc/m²-day-atm, which was measured by ASTM D3985.

Example 6

PET/Surface Functional Layer/Stack of 200 Layers of Alternating $Al_2O_3$ and $ZrO_2$/Protection Layer The PET/surface functional layer in Example 6 was similar to that in Example 4. A stack of alternating $Al_2O_3$ and $ZrO_2$ layers was formed on the PET/surface functional layer by ALD, which was performed with precursors of TMA, TDMAZr, and water. In the ALD cycle, the conduction period of the TMA was fixed at 20 milliseconds, and the conduction period of the TDMAZr was verified as X (X=2, 5, 10, 20, 30, 50, 100, 200, 300, 500) milliseconds for checking its influence on the gas barrier property. The ALD steps in Example 6 were similar to those in Example 3.

One cycle of the above steps (1) to (8) formed a stack of alternating $Al_2O_3$ and $ZrO_2$ layers. The cycle was repeated 200 times to deposit a stack of alternating aluminum oxide and zirconium oxide layers (200 layers of alternating $Al_2O_3$/$ZrO_2$) on the PET/surface functional layer. Thereafter, a UV glue of polyurethane-acrylic acid was coated on the inorganic stack layer by spin-on coating, and then cured by a UV exposure machine to form a protection layer. As such, a gas barrier composite film structure of PET/surface functional layer/stack of 200 layers of alternating $Al_2O_3$ and $ZrO_2$/protection layer was completed. When the aluminum oxide conduction period and the zirconium oxide conduction period had a ratio of 20:30, the gas barrier composite film had an oxygen transmission rate of 0.02 cc/m²-day-atm (measured by ASTM D3985), and a water vapor transmission rate of less than 0.0005 g/m²-day (measured by ASTM F1249). Moreover, the gas barrier composite film had an oxygen transmission rate of 0.04 cc/m²-day-atm and a water vapor transmission rate of 0.001 g/m²-day after being put at 25° C. and 60% RH for 30 days.

Examples 4 to 6 are tabulated in Table 2.

TABLE 2

|  | Example 4 | Example 5 | Example 6 |
| --- | --- | --- | --- |
| Substrate layer | PET | PET | PET |
| Surface functional layer | Copolymer of 30 mol % of acrylic acid and 70 mol % of vinylidene dichloride | Copolymer of 30 mol % of acrylic acid and 70 mol % of vinylidene dichloride | Copolymer of 30 mol % of acrylic acid and 70 mol % of vinylidene dichloride |
| Inorganic stack layer (total 200 layers) | Pure $Al_2O_3$ layers, total 200 layers, and each layer had a thickness of about 1.2 Å | Pure $ZrO_2$ layers, total 200 layers, and each layer had a thickness of about 1.2 Å | Stack of alternating $Al_2O_3$/$ZrO_2$, total 200 layers, and each layer had a thickness of about 1.2 Å |
| Oxygen transmission rate (ASTM D3985) | 0.05 cc/m²-day-atm | 4.5 cc/m²-day-atm | 0.02 cc/m²-day-atm |

As shown in Tables 1 and 2, the stack of alternating $Al_2O_3$ and $ZrO_2$ has a higher gas barrier effect than a stack of the pure material (e.g. $Al_2O_3$ or $ZrO_2$).

For proving the gas barrier effect of the surface functional layer, Comparative Examples 1 to 6 were provided below.

Comparative Example 1

PET/200 Layers of $Al_2O_3$/Protection Layer

PET with a thickness of 188 μm was selected as a substrate layer. An inorganic stack layer of pure aluminum oxide layers was formed on the PET substrate layer by ALD, which was performed with precursors of TMA and water. The ALD steps in Comparative Example 1 were similar to those in Example 1.

One cycle of the above steps (1) to (4) formed one $Al_2O_3$ layer. The cycle was repeated 200 times to deposit a pure aluminum oxide stack layer (200 layers of $Al_2O_3$) on the PET substrate layer. Thereafter, a UV glue of polyurethane-acrylic acid was coated on the inorganic stack layer by spin-on coating, and then cured by a UV exposure machine to form a protection layer. As such, a gas barrier composite film structure of PET/200 layers of $Al_2O_3$/protection layer was completed. The gas barrier composite film structure in Comparative Example 1 had an oxygen transmission rate of 0.06 cc/m²-day-atm, which was measured by ASTM D3985.

Comparative Example 2

PET/200 Layers of $ZrO_2$/Protection Layer

PET film was selected as a substrate layer. An inorganic stack layer of pure zirconium oxide layers was formed on the PET film by ALD, which was performed with precursors of TDMAZr and water. The ALD steps in Comparative Example 2 were similar to those in Example 2.

One cycle of the above steps (1) to (4) formed one $ZrO_2$ layer. The cycle was repeated 200 times to deposit a pure zirconium oxide stack layer (200 layers of $ZrO_2$) on the PET substrate layer. Thereafter, a UV glue of polyurethane-acrylic acid was coated on the inorganic stack layer by spin-on coating, and then cured by a UV exposure machine to form a protection layer. As such, a gas barrier composite film structure of PET/200 layers of $ZrO_2$/protection layer was completed. The gas barrier composite film structure in Comparative Example 2 had an oxygen transmission rate of 8 cc/m²-day-atm, which was measured by ASTM D3985.

Comparative Example 3

PET/Stack of 200 Layers of Alternating $Al_2O_3$ and $ZrO_2$/Protection Layer

PET film was selected as a substrate layer. A stack of alternating $Al_2O_3$ and $ZrO_2$ layers was formed on the PET film by ALD, which was performed with precursors of TMA, TDMAZr, and water. In the ALD cycle, the conduction period of the TMA was fixed at 20 milliseconds, and the conduction period of the TDMAZr was verified as X (X=2, 5, 10, 20, 30, 50, 100, 200, 300, 500) milliseconds for checking its influence on the gas barrier property. The ALD steps in Comparative Example 3 were similar to those in Example 3.

One cycle of the above steps (1) to (8) formed a stack of alternating $Al_2O_3$ and $ZrO_2$ layers. The cycle was repeated 200 times to deposit a stack of alternating aluminum oxide and zirconium oxide layers (200 layers of $Al_2O_3/ZrO_2$) on the PET substrate layer. Thereafter, a UV glue of polyurethane-acrylic acid was coated on the inorganic stack layer by spin-on coating, and then cured by a UV exposure machine to form a protection layer. As such, a gas barrier composite film structure of PET/stack of 200 layers of alternating $Al_2O_3$ and $ZrO_2$/protection layer was completed. When the aluminum oxide conduction period and the zirconium oxide conduction period had a ratio of 20:30, the gas barrier composite film had an oxygen transmission rate of 0.03 cc/m²-day-atm (measured by ASTM D3985), and a water vapor transmission rate of less than 0.0005 g/m²-day (measured by ASTM F1249). Moreover, the gas barrier composite film had an oxygen transmission rate of 0.1 cc/m²-day-atm and a water vapor transmission rate of 0.01 g/m²-day after being put at 25° C. and 60% RH for 30 days.

Comparative Example 4

PET/Surface Functional Layer of a Copolymer of Bisphenol a and Phosgene/200 Layers of $Al_2O_3$/Protection Layer The gas barrier composite film structure in Comparative Example 4 was similar to that in Example 4, and the difference in Comparative Example 4 was the surface functional layer being replaced with a copolymer of bisphenol A and phosgene (thickness of 80 μm). As such, the gas barrier composite film structure in Comparative Example 4 had an oxygen transmission rate of 3 cc/m²-day-atm, which was measured by ASTM D3985.

Comparative Example 5

PET/Surface Functional Layer of a Copolymer of Bisphenol a and Phosgen/200 Layers of $ZrO_2$/Protection Layer The gas barrier composite film structure in Comparative Example 5 was similar to that in Example 5, and the difference in Comparative Example 5 was the surface functional layer being replaced with a copolymer of bisphenol A and phosgene (thickness of 80 μm). As such, the gas barrier composite film structure in Comparative Example 5 had an oxygen transmission rate of 8 cc/m²-day-atm, which was measured by ASTM D3985.

Comparative Example 6

PET/Surface Functional Layer of a Copolymer of Bisphenol a and Phosgen/Stack of 200 Layers of Alternating $Al_2O_3$ and $ZrO_2$/Protection Layer The gas barrier composite film structure in Comparative Example 6 was similar to that in Example 6, and the difference in Comparative Example 6 was the surface functional layer being replaced with a copolymer of bisphenol A and phosgene (thickness of 80 μm). As such, the gas barrier composite film structure in Comparative Example 6 had an oxygen transmission rate of 1.5 cc/m²-day-atm, which was measured by ASTM D3985.

The gas barrier composite films with different surface functional layers in Examples and Comparative Examples had different oxygen transmission rates (measured by ASTM D3985), as tabulated in Table 3.

TABLE 3

| Examples and Comparative examples | Surface functional layer | Inorganic coating type (layers) | | |
|---|---|---|---|---|
| | | Aluminum oxide (200 layers) | Zirconium oxide (200 layers) | Aluminum oxide/zirconium oxide (200 layers) |
| Examples 1-3 | Copolymer of p-hydroxybenzoic acid and 6-hydroxy-2-naphthoic acid | OTR = 0.05 | OTR = 0.41 | OTR = 0.02 |
| Examples 4-6 | Copolymer of acrylic acid and vinylidene dichloride | OTR = 0.05 | OTR = 4.5 | OTR = 0.02 |
| Comparative Examples 1-3 | None | OTR = 0.06 | OTR = 8 | OTR = 0.03 |
| Comparative Examples 4-6 | Copolymer of bisphenol A and phosgen | OTR = 3 | OTR = 8 | OTR = 1.5 |

The unit of the oxygen transmission rate (OTR) is cc/m²-day-atm.

The PET surface would be hydrolyzed after long time, such that the interface between the PET contacting the inorganic layer may defect to reduce the gas barrier property. The surface functional layer with a higher gas barrier effect and a higher affinity than the PET is introduced in the disclosure. The surface functional layer may avoid the hydrolysis of PET and the corresponding defect, thereby further improving the gas barrier effect to increase the long-term stability of the gas barrier composite film.

The Examples and Comparative Examples are tabulated in Table 4.

TABLE 4

| Examples and Comparative examples | Surface functional layer | OTR (cc/m²-day-atm) | | WVTR (g/m²-day) | |
|---|---|---|---|---|---|
| | | 0 day | 30 days | 0 day | 30 days |
| Example 3 | Copolymer of 73 mol % of p-hydroxybenzoic acid and 27 mol % of 6-hydroxy-2-naphthoic acid | 0.02 | 0.05 | <0.0005 | 0.001 |
| Example 6 | Copolymer of 30 mol % of acrylic acid and 70 mol % of vinylidene dichloride | 0.02 | 0.04 | <0.0005 | 0.001 |
| Comparative Example 3 | None | 0.03 | 0.1 | <0.0005 | 0.01 |
| Comparative Example 6 | Copolymer of bisphenol A and phosgen | 1.5 | Not analyzed | Not analyzed | Not analyzed |

It will be apparent to those skilled in the art that various modifications and variations can be made to the disclosed methods and materials. It is intended that the specification and examples be considered as exemplary only, with a true scope of the disclosure being indicated by the following claims and their equivalents.

What is claimed is:

1. A gas barrier composite film, comprising:
   a substrate layer;
   a surface functional layer disposed on one or two sides of the substrate layer, wherein the functional layer is a first copolymer formed by polymerization consisting only of 73 mol % to 80 mol % of p-hydroxybenzoic acid and 27 mol % to 20 mol % of 6-hydroxy-2-naphthoic acid, and
   an inorganic stack layer disposed on the functional layer, wherein the inorganic stack layer includes a stack of at least two alternating layers selected from a group consisting of aluminum oxide, zinc oxide, zirconium oxide, hafnium oxide, and indium nitride.

2. The gas barrier composite film as claimed in claim 1, wherein the substrate layer comprises polyethylene terephthalate, polyethylene naphthalate, poly(methyl methacrylate), polycarbonate, polyethersulfone, polyetheretherketone, or a combination thereof.

3. The gas barrier composite film as claimed in claim 1, wherein the surface functional layer has a thickness of 0.1 μm to 100 μm.

4. The gas barrier composite film as claimed in claim 1, wherein the surface functional layer has a thickness of 1 μm to 50 μm.

5. The gas barrier composite film as claimed in claim 1, wherein each of the layers in the inorganic stack layer has a thickness of 1 Å to 2 Å, and the inorganic stack layer has a total thickness of 10 nm to 50 nm.

6. The gas barrier composite film as claimed in claim 1, further comprising a protection layer disposed on the inorganic stack layer, wherein the protection layer comprises polyurethane-acrylate, epoxy acrylate, polyacrylate, polyester, or a combination thereof.

7. The gas barrier composite film as claimed in claim 1, being applied to a gas barrier substrate or a back sheet in a flexible electronic device, wherein the flexible electronic device includes electronic paper, organic light emitting diode, organic solar cell, or thin film solar cell.

8. The gas barrier composite film as claimed in claim 1, wherein the inorganic stack layer includes aluminum oxide layers alternating with layers selected from a group consisting of zinc oxide, zirconium oxide, hafnium oxide, and indium nitride.

9. The gas barrier composite film as claimed in claim 8, wherein the inorganic stack layer includes the aluminum oxide layers alternating with the zirconium oxide layers.

* * * * *